United States Patent [19]

Rostoker et al.

[11] Patent Number: 5,521,108
[45] Date of Patent: May 28, 1996

[54] PROCESS FOR MAKING A CONDUCTIVE GERMANIUM/SILICON MEMBER WITH A ROUGHENED SURFACE THEREON SUITABLE FOR USE IN AN INTEGRATED CIRCUIT STRUCTURE

[75] Inventors: Michael D. Rostoker, Boulder Creek; Ashok Kapoor, Palo Alto, both of Calif.

[73] Assignee: LSI Logic Corporation, Milpitas, Calif.

[21] Appl. No.: 121,679

[22] Filed: Sep. 15, 1993

[51] Int. Cl.⁶ .............................................. H01L 21/8247
[52] U.S. Cl. ...................... 437/43; 437/196; 437/234; 437/977; 148/DIG. 59
[58] Field of Search ...................... 437/101, 43, 977, 437/233, 234, 238, 131, 196; 257/321; 148/DIG. 58.9

[56] References Cited

U.S. PATENT DOCUMENTS

| | | | |
|---|---|---|---|
| 4,442,449 | 4/1984 | Lehrer et al. | |
| 4,735,919 | 4/1988 | Faraone | 437/43 |
| 4,757,360 | 7/1988 | Faraone et al. | |
| 4,948,750 | 8/1990 | Kausche et al. | 437/101 |
| 4,957,777 | 9/1990 | Ilderem et al. | 427/55 |
| 4,975,387 | 12/1990 | Prokes et al. | 437/131 |
| 5,017,505 | 5/1991 | Fujii et al. | 437/52 |
| 5,081,066 | 1/1992 | Kim | 437/200 |
| 5,087,583 | 2/1992 | Hazani | 437/43 |
| 5,110,752 | 5/1992 | Lu | 437/47 |
| 5,182,232 | 1/1993 | Chhabra et al. | 437/200 |
| 5,223,081 | 6/1993 | Doan | 156/628 |
| 5,238,855 | 8/1993 | Gill | 437/43 |
| 5,241,193 | 8/1993 | Pfiester et al. | 257/67 |
| 5,312,766 | 5/1994 | Aronowitz et al. | 437/24 |

FOREIGN PATENT DOCUMENTS 61019147A 1/1986 Japan.

OTHER PUBLICATIONS

Wolf, "Silicon Processing for the VLSI Era", vol. 1, pp. 303–308, 1986.

Liu et al., "Instability of a $Ge_xSi_{1-x}O_2$ film on a $Ge_xSi_{1-x}$ layer", Journal of Applied Physics, Nov. 1992, vol. 72, No. 9, pp. 4444–4446.

Primary Examiner—George Fourson
Assistant Examiner—Richard A. Booth
Attorney, Agent, or Firm—John P. Taylor

[57] ABSTRACT

A conductive member is described with a surface of controlled roughness thereon which is useful in the construction of an integrated circuit structure. In a preferred embodiment, the conductive member is formed using a mixture of germanium and silicon which is then oxidized, resulting in the formation of a roughened surface on the germanium/silicon conductive member due to the difference in the respective rates of oxidation of the germanium and silicon. After oxidation of the conductive member, the oxide layer may be removed, leaving the roughened surface on the germanium/silicon conductive member. When an integrated circuit structure such as an EPROM is to be formed using this conductive member with a roughened surface, a further layer of oxide is then deposited over the roughened surface followed by deposition of a second layer of conductive material such as polysilicon or a germanium/silicon mixture, from which the control gate will be formed. A further oxide layer may then be formed over the second conductive layer followed by a patterning step to respectively form the floating gate (from the germanium/silicon layer) and the control gate from the second conductive layer.

22 Claims, 3 Drawing Sheets

```
FORMING A LAYER OF GERMANIUM
AND SILICON ON A SUBSTRATE
          │
GROWING A LAYER OF OXIDE ON THE SURFACE
OF THE GERMANIUM/SILICON LAYER
TO FORM A ROUGHENED SURFACE
ON THE GERMANIUM/SILICON LAYER
          │
REMOVING THE OXIDE LAYER OVER
THE GERMANIUM/SILICON LAYER
```

PROCESS FOR MAKING A CONDUCTIVE GERMANIUM/SILICON MEMBER WITH A ROUGHENED SURFACE THEREON SUITABLE FOR USE IN AN INTEGRATED CIRCUIT STRUCTURE

BACKGROUND OF THE INVENTION

1. Field of the Invention

This invention relates to integrated circuit structures formed on a semiconductor wafer. More particularly, this invention relates to an integrated circuit structure having an electrode with a roughened surface formed thereon, and a process for forming same.

2. Description of the Related Art

In the formation of integrated circuit structures on semiconductor wafers, it is sometimes desirable to provide, on a conductive element such as an electrode, a roughened surface. Such a roughened surface, for example, is useful on the surface of a floating gate facing the control gate in an erasable programmed read only memory (EPROM) device. Such a roughened surface, or asperities, formed on the floating gate of an EPROM device cause a more desirable controlled breakdown of the oxide between the floating gate and the control gate, known as Fowler-Nordheim tunneling, rather than an avalanche breakdown through the oxide during discharge of the floating gate electrode.

However, such formation of a roughened surface of controlled texture, for example, on a metal or silicon surface, is not always easily accomplished on a reliably reproducible basis. would, therefore, be desirable to provide an integrated circuit structure having a conductive member, such as a floating gate in an EPROM, with a surface of controlled roughness thereon, and a process for forming same.

SUMMARY OF THE INVENTION

It is, therefore, an object of the invention to provide an integrated circuit structure having a conductive member with a surface of controlled roughness thereon.

It is another object of the invention to provide a process for forming an integrated circuit structure having a conductive member with a surface of controlled roughness thereon.

The invention comprises a conductive member with a surface of controlled roughness thereon which is useful in the construction of an integrated circuit structure. The conductive member is formed from a first conductive layer comprising a mixture of oxidizable conductive or semiconductive materials, such as a mixture of germanium and silicon, which is then oxidized, resulting in the formation of a roughened surface on the conductive layer due to the difference in the respective rates of oxidation of the materials such as germanium and silicon comprising the conductive layer. After oxidation of the conductive layer, the oxide layer may be removed, leaving the roughened surface on the conductive layer. When an integrated circuit structure such as an EPROM is to be formed using this conductive layer with a roughened surface, a further layer of oxide is then deposited over the roughened surface followed by deposition of a second layer of conductive material, e.g., such as polysilicon or a germanium/silicon mixture, from which the control gate will be formed.

A further oxide layer may then be formed over the second conductive layer followed by a patterning step to respectively form the floating gate having a roughened surface thereon (from the first conductive layer) and the control gate from the second conductive layer.

DETAILED DESCRIPTION OF THE INVENTION

The invention comprises an integrated circuit structure with a conductive member having a roughened surface formed thereon and a process for making same. Such an integrated circuit structure having a roughened surface conductive member, and the formation of same, will be described below with respect to the formation of an EPROM device, by way of illustration and not of limitation.

The term "roughened surface", as used herein, is defined as a surface having localized regions where electric fields would be increased by more than 10% above the average electric field, as measured in other portions of the same surface, i.e., a surface in which the electric fields are not homogeneous throughout the surface.

Figure 1:
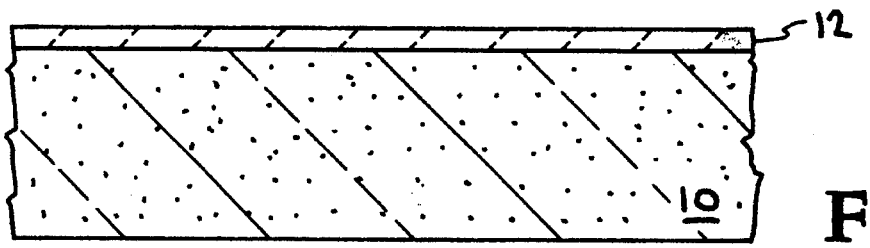
FIGS. 1–8 are fragmentary vertical cross-sectional views which sequentially show the construction of an integrated circuit structure having a floating electrode comprising, as an example, a germanium/silicon material with a roughened upper surface thereon facing an upper control electrode.

Turning now to FIG. 1, a semiconductor substrate, which may comprise a silicon wafer, is shown at 10, having a silicon oxide gate oxide layer 12 formed thereover, as the initial step in forming an integrated circuit structure incorporating therein the conductive member having a roughened surface thereon of the invention.

Figure 2:
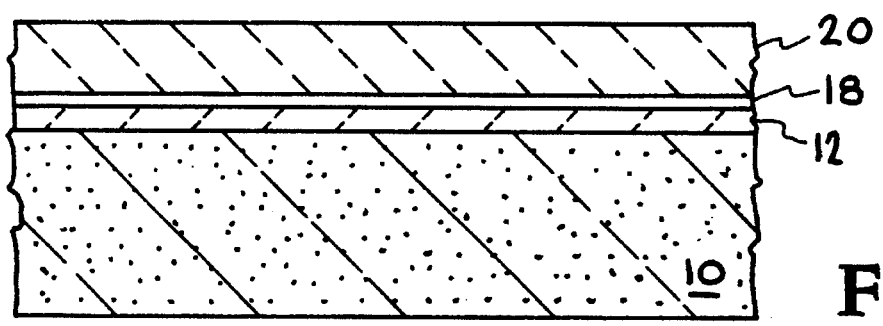

In accordance with the invention, as shown in FIG. 2, a thin layer of silicon 18, having a thickness of from about 200 Angstroms to about 500 Angstroms, is optionally deposited over oxide layer 12 as a seeding layer for further deposition. Next a conductive layer 20 is then formed over oxide layer 12. Conductive layer 20 may comprise a mixture of any two conductive and/or semiconductive materials capable of reacting to thereby form a roughened surface thereon.

In one embodiment, conductive layer 20 comprises a mixture of two or more conductive and/or semiconductive materials capable of oxidizing at different rates to form the desired toughened surface thereon. Such materials may include, for example, silicon, germanium, and/or carbon. For purposes of illustration, and not by way of limitation, conductive layer 20 will hereinafter be described as a mixture of germanium and silicon.

Preferably, germanium/silicon layer 20 is formed over gate oxide layer 12 by a CVD process whereby one or more silicon-containing gases and one or more germanium-containing gases are flowed into a vacuum deposition chamber to deposit on a wafer therein. However, any other process capable of producing a layer of controlled germanium/silicon ratio may be used to form germanium/silicon layer 20.

Examples of gases which may be used in a CVD process to deposit silicon include silane ($SiH_4$), disilane ($Si_2H_6$), and dichlorosilane ($SiCl_2H_2$). Germane ($GeH_4$) is an example of a gas which may be used in a CVD process to deposit germanium. The ratio of germanium to silicon to be deposited may be controlled by controlling the ratio of silicon-containing gas to germanium-containing gas being flowed into the vacuum deposition chamber. Generally the ratio of germanium to silicon in the deposited layer should vary from about 1 wt. % to about 70 wt. % germanium, and preferably from about 10 wt. % to about 50 wt. % germanium, with the balance comprising silicon.

The germanium/silicon layer, when deposited by a CVD process, may be deposited at a pressure ranging from about 10 milliTorr to about 1 Torr, and while maintaining a deposition temperature within a range of from about 300° C. to about 700° C.

The silicon-containing gas and the germanium-containing gas may be flowed into the deposition chamber together with a non-reactive carrier gas such as, for example, nitrogen, argon, or helium. The amounts of the respective gases flowed into the deposition chamber, using as an example, a 10 liter deposition chamber, may range from about 10 to about 5000 standard cubic centimeters/minute (sccm) of germanium-containing gas, from about 10 to about 500 sccm of silicon-containing gas, and from about 0 to about 2000 sccm of one or more carrier gases, to achieve the desired ratio of germanium to silicon in the deposited layer.

The thickness of the germanium/silicon layer will be dependent on the flow rates of the incoming gases, the temperature, pressure, and time of deposition. Preferably, the thickness of the deposited germanium/silicon layer will vary from about 1000 Angstroms to about 6000 Angstroms, and most preferably from about 2000 Angstroms to about 4000 Angstroms, with a typical thickness being about 3000 Angstroms.

The conductivity of the germanium/silicon layer may be increased either by adding one or more doping agents, e.g., boron, phosphorous, or arsenic, to the mixture of germanium and silicon as it is formed, or by implanting the germanium/silicon layer, after formation, with one or more doping agents such as boron, phosphorous, or arsenic. Subsequent annealing to activate the dopant may be carried out at the same time as the control gate electrode is annealed (if an EPROM device is being constructed) as will be discussed below. The amount of dopant which should be added to the germanium/silicon layer to render it sufficiently conductive for use as a conductive electrode in an integrated circuit structure will vary from about $10^{19}$ atoms/cm$^3$ to about $10^{21}$ atoms/cm$^3$.

Figure 3:
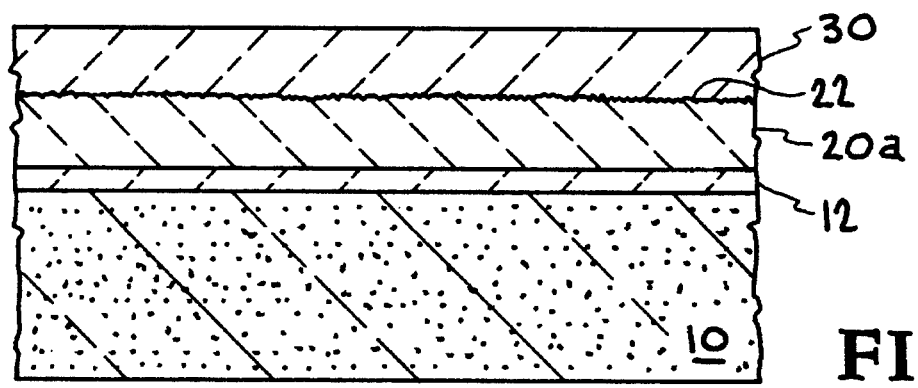

After formation of germanium/silicon layer 20 over gate oxide layer 12, a layer of oxide 30 is grown over/in germanium/silicon layer 20, as shown in FIG. 3. Oxide layer 30 comprises a mixture of germanium oxide and silicon oxide. As shown in FIG. 3, the difference in oxidation rates of the germanium and the silicon in germanium/silicon layer 20 results in an irregular or roughened surface 22 on remaining germanium/silicon layer 20a, in accordance with the invention. The amount of such roughening of surface 22 may be adjusted by adjusting the amount of germanium present in original germanium/silicon layer 20 (the germanium/silicon layer prior to the oxidation step).

To provide a sufficient amount of oxidation and resultant surface roughening, at least about 1000 Angstroms of oxide 30 should be grown over/in original germanium/silicon layer 20. Greater amounts of oxide, i.e., greater than 1000 Angstroms, can be grown, but are not deemed to be necessary to achieve the desired roughened surface 22. In fact excessive oxide growth is undesirable since the total thickness of the remaining germanium/silicon layer 20a may be undesirably reduced.

Figure 4:
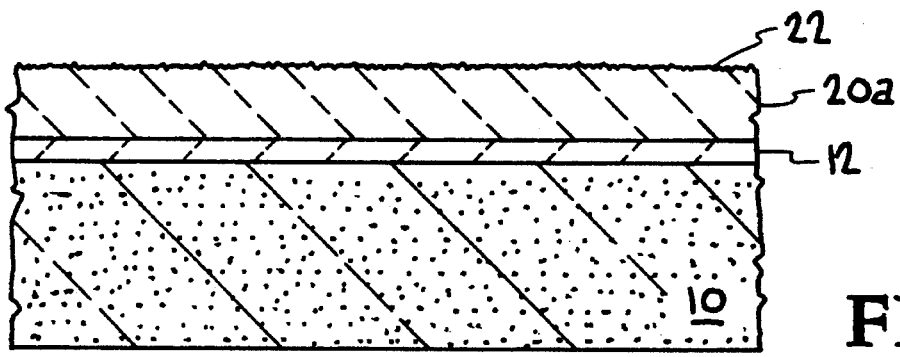

After the step of growing oxide layer 30 to achieve the desired roughened germanium/silicon surface 22 in remaining germanium/silicon layer 22a, oxide layer 30 may be removed by any selective wet or dry oxide removal process such as, for example, using dilute HF or a rinse in water followed by plasma etching of the SiO$_2$, i.e., oxide layer 30, using CHF$_3$, resulting in the structure shown in FIG. 4.

Figure 5:
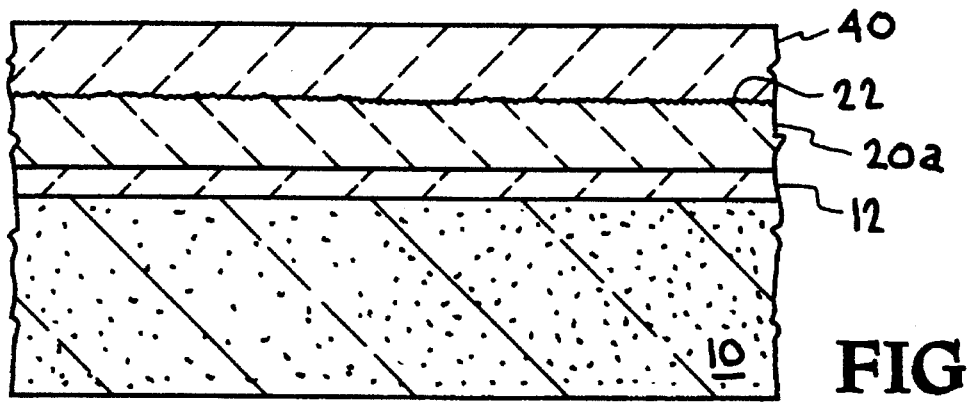

After removal of grown oxide layer 30, a further oxide layer 40 may be deposited, for example by a CVD process, to a thickness ranging from about 200 Angstroms to about 2000 Angstroms, as shown in FIG. 5. Any conventional oxide deposition process may be used to deposit oxide layer 40 over germanium/silicon layer 20a.

Figure 6:
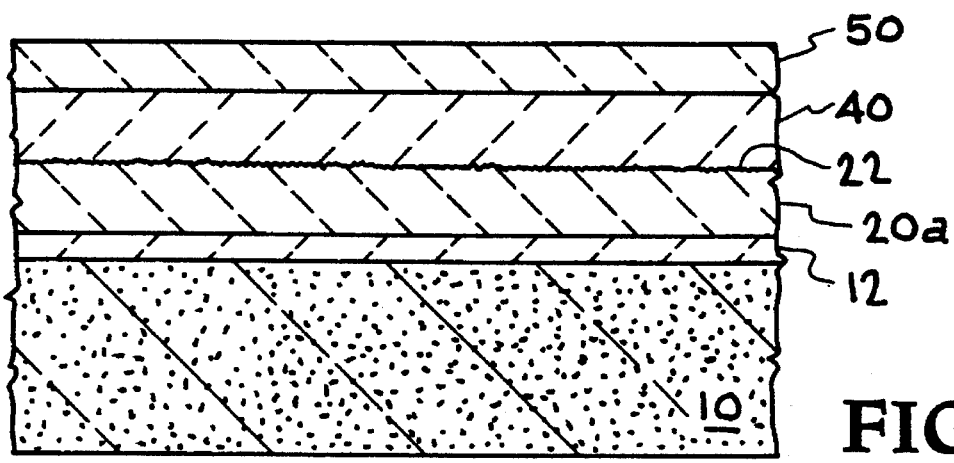

After formation of deposited oxide layer 40 over germanium/silicon layer 20a having roughened surface 22 thereon, a further conductive layer 50 may be formed over oxide layer 40, as shown in FIG. 6. Layer 50 may be used, for example, to form the control gate of an EPROM device. Conductive layer 50 could comprise a polysilicon layer, but preferably will comprise a mixture of germanium and silicon. Such a germanium/silicon mixture is preferable to a silicon layer to permit annealing of previously doped layer 20a and layer 50 (after implantation with a dopant) at a lower temperature rather than annealing at a temperature of about 950° C., which would be necessary for activation of an implanted silicon layer. This higher annealing temperature, i.e., 950° C., is deemed to be an unsatisfactorily high temperature for further processing of the structure. This is due to the presence of germanium/silicon layer 20a previously formed thereon, and particularly in view of the previously formed roughened surface 22 thereon. Such a high annealing temperature could result in some flow of underlying germanium/silicon layer 20a, resulting in an undesirable smoothing of previously formed roughened surface 22 thereon.

Thus, when layer 50 is formed of a germanium/silicon mixture, both layer 20a and layer 50 may be annealed or activated at the same time at a lower temperature of from about 500° C. to about 600° C. for a period of from about 30 minutes to about an hour without damage to the previously formed roughened surface 22 on layer 20a.

It should be noted, however, that a higher annealing temperature, e.g., from about 900° C. to about 950° C., can be used in connection with a rapid thermal anneal (RTA) process, since the high temperature in such an anneal is only maintained for a period of from about 30 seconds to about 2 minutes. In such a case, either a doped germanium/silicon layer or a doped polysilicon layer may be used as second conductive layer 50.

Germanium/silicon layer 50 may be formed using the previously described process for CVD formation of germanium/silicon layer 20 from a mixture of one or more germanium-containing gases and one or more silicon-containing gases. Germanium/silicon layer 50 is deposited to a thickness which may range from about 1000 Angstroms to about 6000 Angstroms, preferably from about 2000 Angstroms to about 4000 Angstroms, and typically about 3000 Angstroms.

Figure 7:
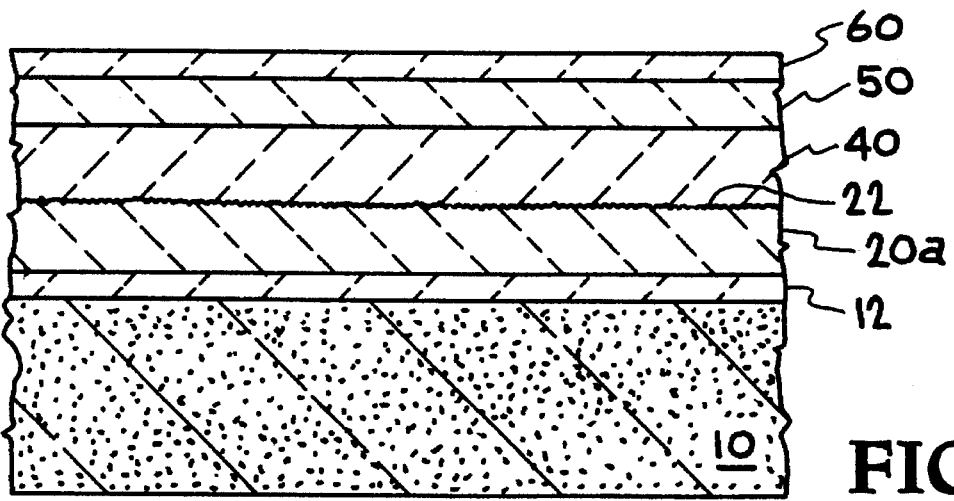

After formation of germanium/silicon layer 50 over the structure, a further protective layer 60 may be deposited by any suitable process over germanium/silicon layer 50, as shown in FIG. 7. Protective layer 60 may comprise at least about 200 Angstroms of a protective layer of oxide or nitride to protect the structure prior to further processing.

Figures 8, 9:
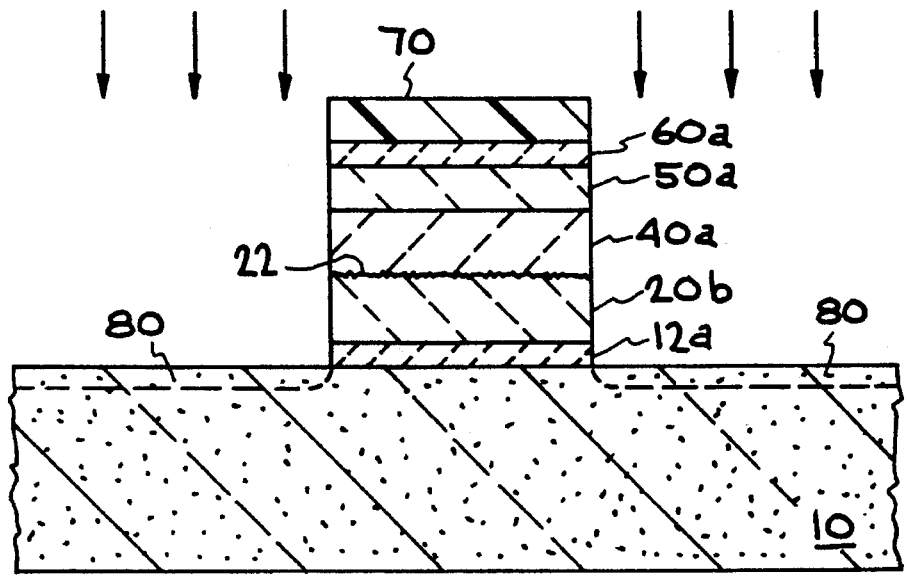
FIG. 9 is a flow sheet illustrating the process of the invention.

Subsequently, as shown in FIG. 8, the structure may be patterned, using a photoresist mask 70, to remove selected portions of layers 12, 20a, 40, 50, and 60, thereby exposing substrate 10. These exposed portions of substrate 10 may then be conventionally implanted, as shown in FIG. 8, e.g., with arsenic or phosphorus, to form source and drain regions 80 in substrate 10 adjacent gate oxide portion 12a, floating electrode 20b, oxide portion 40a, control electrode 50a, and oxide portion 60a which remain after the patterning step. For devices with small channel lengths, lightly doped drains (LDD) may be formed.

Thus, the invention provides a conductive member with a surface of controlled roughness thereon which is useful in the construction of an integrated circuit structure, such as, for example, an EPROM device. The conductive member can be formed using a mixture of germanium and silicon which is then oxidized, resulting in the formation of a roughened surface on the germanium/silicon conductive member due to the difference in the respective rates of oxidation of the germanium and silicon.

Having thus described the invention what is claimed is:

1. A process for making a conductive member suitable for use in an integrated circuit structure, said conductive member comprising a mixture of germanium and silicon and formed with a roughened surface thereon which comprises the steps of:
   a) forming a layer of a mixture of germanium and silicon on a substrate;
   b) growing a first oxide layer on the surface of said layer of germanium and silicon;
   c) removing said first oxide layer from said surface of said germanium and silicon layer, leaving a roughened surface on said layer of germanium and silicon; and
   d) depositing a second oxide layer on said roughened surface of said layer of germanium and silicon.

2. The process of claim 1, including the further step of patterning said layer of germanium and silicon having said roughened surface thereon to form said conductive member.

3. The process of claim 2 wherein said step of forming said layer of germanium and silicon on said substrate further comprises forming said germanium/silicon layer by a CVD process.

4. The process of claim 3 wherein said CVD process further comprises flowing one or more germanium-containing gases and one or more silicon-containing gases into a CVD chamber containing said substrate.

5. The process of claim 4 wherein said CVD process further comprises adjusting the flow of said one or more germanium-containing gases and said one or more silicon-containing gases to deposit a germanium/silicon layer comprising from about 1 wt. % to about 70 wt. % germanium, with the balance comprising silicon.

6. The process of claim 4 wherein said CVD process further comprises adjusting the flow of said one or more germanium-containing gases and said one or more silicon-containing gases to deposit a germanium/silicon layer comprising from about 10 wt. % to about 50 wt. % germanium, with the balance comprising silicon.

7. The process of claim 6 wherein said CVD process further comprises flowing germane gas and silane gas into said CVD chamber.

8. A process of making a conductive member suitable for use in an integrated circuit structure, comprising a mixture of germanium and silicon formed with a roughened surface thereon which comprises the steps of:
   a) depositing, by a CVD process, a layer of a mixture of germanium and silicon on a substrate, said layer comprising from about 10 wt. % to about 50 wt. % germanium, with the balance comprising silicon;
   b) growing a first oxide layer of at least about 500 Angstroms in thickness on the surface of said layer of germanium and silicon comprising a mixture of germanium oxide and silicon oxide;
   c) removing said first layer of oxide grown on said surface of said layer of germanium and silicon, leaving a roughened surface on said layer of germanium and silicon; and
   d) depositing a second oxide layer on said roughened surface of said layer of germanium and silicon.

9. A process of making an integrated circuit structure comprising a first conductive member having a roughened surface thereon and a second conductive member insulatively spaced from said first conductive member which comprises the steps of:
   a) forming a first conductive layer comprising a mixture of germanium and silicon on a substrate;
   b) growing a first oxide layer on the surface of said first conductive layer of germanium and silicon to thereby form said roughened surface on said layer of germanium and silicon; p1 c) removing said first oxide layer grown on said surface of said germanium/silicon layer;
   d) depositing a second oxide layer over said germanium/silicon layer; and
   e) forming a second conductive layer over said second oxide layer;
whereby said roughened surface of said first conductive layer faces said second conductive layer.

10. The process of claim 9 including the further steps of:
   a) depositing a further oxide layer over said second conductive layer; and
   b) patterning said structure to respectively form a floating gate electrode from said germanium/silicon layer and a control gate electrode from said second conductive layer.

11. The process of claim 10 including the further step of forming a gate oxide layer over said substrate prior to said step of forming said first conductive layer of germanium and silicon on said substrate.

12. The process of claim 11 including the further step of implanting said substrate to form source and drain areas therein after said step of patterning said structure.

13. The process of claim 12 wherein said step of forming said second conductive layer over said second oxide layer further comprises forming a second conductive layer of germanium and silicon.

14. The process of claim 13 including the further steps of doping said first and second conductive layers of germanium and silicon.

15. The process of claim 14 including the further step of annealing said doped first and second conductive layers of germanium and silicon at a temperature of from about 500° C. to about 600° C. for a period of at least about 30 minutes.

16. The process of claim 14 including the further step of annealing said doped first and second conductive layers of germanium and silicon at a temperature of from about 900° C. to about 950° C. for a period of from about 30 seconds to about 2 minutes.

17. The process of claim 12 wherein said step of growing said first oxide layer on said surface of said first conductive layer of germanium and silicon further comprises growing at least about 500 Angstroms of said oxide to form said roughened surface on said first conductive layer.

18. The process of claim 17 wherein said step of forming said first conductive layer of germanium and silicon further comprises depositing from about 1000 Angstroms to about 6000 Angstroms of germanium and silicon.

19. The process of claim 17 wherein said step of forming said first conductive layer of germanium and silicon further comprises depositing from about 2000 Angstroms to about 4000 Angstroms of germanium and silicon.

20. A process of making an integrated circuit structure comprising a first conductive member having a roughened surface thereon and a second conductive member insulatively spaced from said first conductive member which comprises:
   a) forming a gate oxide layer over a substrate;
   b) depositing, by a CVD process, a first conductive layer of germanium and silicon over said gate oxide layer comprising from about 10 wt. % to about 50 wt. % germanium, with the balance comprising silicon;
   c) growing an oxide layer of at least about 500 Angstroms in thickness on the surface of said layer of germanium and silicon to form said roughened surface thereon;
   d) removing said layer of oxide grown on said surface of said germanium/silicon layer;
   e) doping said first conductive layer;
   f) depositing a second oxide layer over said germanium/silicon layer;
   g) forming a second conductive layer over said second oxide layer;
   h) doping said second conductive layer;
   i) annealing said first and second conductive layers;
   j) patterning said structure to form a floating gate electrode and a control gate electrode over said substrate; and
   k) doping said substrate to form source and drain areas therein.

21. The process of forming an integrated circuit structure of claim 20 including the additional step of forming a further insulation layer over said second conductive layer.

22. A process for making a conductive member suitable for use in an integrated circuit structure, said conductive member comprising a mixture of germanium and silicon and formed with a roughened surface thereon which comprises the steps of:
   a) forming a first silicon oxide gate oxide layer over a semiconductor substrate;
   b) forming a layer of a mixture of germanium and silicon on said gate oxide layer;
   c) growing a second oxide layer on the surface of said layer of germanium and silicon;
   d) removing said second oxide layer from said surface of said layer of germanium and silicon, leaving a roughened surface on said layer of germanium and silicon; and
   e) depositing a third oxide layer on said roughened surface of said layer of germanium and silicon.

* * * * *